(12) United States Patent
Liu

(10) Patent No.: US 10,721,427 B2
(45) Date of Patent: Jul. 21, 2020

(54) IMAGE SENSOR CIRCUIT AND RAMP SIGNAL GENERATOR THEREOF

(71) Applicant: PrimeSensor Technology Inc., Hsinchu (TW)

(72) Inventor: Shiue-Shin Liu, Hsinchu (TW)

(73) Assignee: PRIMESENSOR TECHNOLOGY INC., Hsinchu (TW)

(*) Notice: Subject to any disclaimer, the term of this patent is extended or adjusted under 35 U.S.C. 154(b) by 127 days.

(21) Appl. No.: 16/018,015

(22) Filed: Jun. 25, 2018

(65) Prior Publication Data
US 2019/0394415 A1    Dec. 26, 2019

(51) Int. Cl.
| H04N 5/378 | (2011.01) |
| H04N 5/369 | (2011.01) |
| H03K 4/08 | (2006.01) |
| H03M 1/56 | (2006.01) |

(52) U.S. Cl.
CPC ........... *H04N 5/378* (2013.01); *H03K 4/08* (2013.01); *H03M 1/56* (2013.01); *H04N 5/3696* (2013.01); *H04N 5/3698* (2013.01)

(58) Field of Classification Search
CPC .... H04N 5/3696; H04N 5/3698; H04N 5/378; H03K 4/08; H03M 1/56
See application file for complete search history.

(56) References Cited

U.S. PATENT DOCUMENTS

| 7,379,011 | B2* | 5/2008 | Ham | H03M 1/58 341/128 |
| 7,679,542 | B2 | 3/2010 | Ham et al. | |
| 2002/0067303 | A1* | 6/2002 | Lee | H04N 5/378 341/184 |
| 2007/0046802 | A1* | 3/2007 | Ham | H04N 5/3575 348/308 |
| 2010/0226495 | A1* | 9/2010 | Kelly | G11B 20/00086 380/30 |
| 2015/0022249 | A1* | 1/2015 | Kinyua | H03K 4/50 327/134 |
| 2015/0138411 | A1* | 5/2015 | Nakamura | H03K 5/125 348/300 |
| 2016/0118992 | A1* | 4/2016 | Milkov | H03K 5/1534 341/159 |
| 2018/0167573 | A1* | 6/2018 | Zhu | H04N 5/378 |

* cited by examiner

*Primary Examiner* — Sinh Tran
*Assistant Examiner* — Zhenzhen Wu
(74) *Attorney, Agent, or Firm* — Tung & Associates

(57) ABSTRACT

The present invention discloses an image sensor circuit and a ramp signal generator thereof. The image sensor circuit includes: an active pixel sensor (APS) array which includes plural pixel circuits arranged in an array of columns and rows; plural slope analog-to-digital converter (ADC), wherein each of the slope ADC is coupled to the corresponding column, and generates a digital sampling signal according to a ramp signal together with a pixel signal including a reset signal and a image signal which are generated by the pixel circuit located in the selected row and in the column corresponding to the slope ADC; and the ramp signal generator, which generates the ramp signal, wherein the ramp signal generator includes an active integrator, and the active integrator generates the ramp signal by charging an integration capacitor with a gain current.

10 Claims, 6 Drawing Sheets

IMAGE SENSOR CIRCUIT AND RAMP SIGNAL GENERATOR THEREOF

BACKGROUND OF THE INVENTION

Field of Invention

The present invention relates to an image sensor circuit; particularly, it relates to such an image sensor circuit which includes an active integrator for generating a ramp signal. The present invention also relates to a ramp signal generator for the image sensor circuit.

Description of Related Art

FIG. 1A shows a prior art image sensor circuit 100. As shown in FIG. 1A, the image sensor circuit 100 includes: an active pixel sensor (APS) array 101, a column slope analog-to-digital converter (ADC) circuit 103, a ramp signal generator 105, and a row driver circuit 107. The APS array 101 includes plural pixel circuits arranged in an array of columns and rows, wherein when one of the rows is selected, the pixel circuits 1011 in the selected row sense an image, and generate a reset signal and an image signal in turn. The row driver circuit 107 is for selecting one of the rows in a predetermined order, for example row by row in sequence.

The column slope ADC circuit 103 includes plural slope ADCs, wherein the plural slope ADCs are coupled to the plural columns of the APS array 101 respectively. The slope ADC generates a digital sampling signal Vcds according to a ramp signal Vramp which is generated by the ramp signal generator 105, together with a reset signal PXO_rst and the image signal PXO_img which are generated by the pixel circuit 1011 that is located in the selected row and in the column corresponding to the slope ADC. In general, the digital sampling signal Vcds is related to a difference between the reset signal PXO_rst and the image signal PXO_img. An image which is sensed by the pixel circuit 1011 may be expressed by the digital sampling signal Vcds.

Typically, the slope ADC is used for reducing power consumption. The ramp signal generator 105 generates one single ramp signal Vramp for all the plural slope ADCs in the column slope ADC circuit 103.

To read the reset signal PXO_rst and the image signal PXO_img by the ramp signal Vramp, the slope versus time of the ramp signal Vramp is predetermined, and the periods required for the ramp signal Vramp to intersect the reset signal PXO_rst and the ramp signal Vramp to intersect the image signal PXO_img are obtained respectively, and then the periods are converted to levels of the reset signal PXO_rst and the image signal PXO_img. U.S. Pat. No. 7,679,542 B2 discloses relevant details.

As shown in FIG. 1B, the prior art ramp signal generator 105 includes a digital integrator 1051, a main current mode digital-to-analog converter (DAC) 1053, an offset DAC 1055, and a resistor R1. The digital integrator 1051 of the ramp signal generator 105 generates a ramp control signal (as a stepped waveform indicated shown in FIG. 1B). The main current mode DAC 1053 converts the ramp control signal to a ramp current Iramp which flows through the resistor R1 to generate the ramp signal Vramp in a voltage form. The offset DAC 1055 provides an offset level of the ramp signal Vramp. The bandwidth of Vramp signal is limited by capacitive load $C_L$.

The prior art shown in FIGS. 1A and 1B has at least the following drawbacks:

1. Quantization error: the resolution of the main current mode DAC 1053 affects the resolution of the single slope ADC. To avoid large quantization errors, high resolution of the ramp generator 105 is required, and if the resolution of the single slope ADC is required to be 10 bits, the resolution of the main current mode DAC 1053 needs to be over 10 bits; however, as the resolution becomes higher, the required circuit area of ramp generator is larger due to both mismatch concern and control circuitry.
2. Power/bandwidth tradeoff: in an application of a relatively higher frame rate, a relatively lower resistance of the resistor R1 is required. The voltage level of the ramp signal Vramp is a product of the current flowing through the resistor R1 multiplied by the resistance of the resistor R1. Therefore, if the ramp signal Vramp is set to be a fixed voltage range, it means that either the settings include a relatively lower resistance of the resistor R1 and a relatively higher current flowing through the resistor R1, which will consume a relatively higher power; or, the settings include a relatively higher resistance of the resistor R1 and a relatively lower current flowing through the resistor R1, and in this case the ramp signal bandwidth will be sacrificed (lower). Therefore, in the prior art, either the power utilization efficiency or the operation bandwidth will be sacrificed.

In view of above, the present invention proposes an image sensor circuit and a ramp signal generator thereof which mitigate the aforementioned drawbacks. According to the present invention, in an analog domain, an active integrator generates the ramp signal by charging an integration capacitor with a current in an analog form, to mitigate the aforementioned drawbacks of the prior art, and to increase application range of the image sensor circuit.

SUMMARY OF THE INVENTION

From one perspective, the present invention provides an image sensor circuit. The image sensor circuit includes: an active pixel sensor (APS) array which includes a plurality of pixel circuits arranged in an array of a plurality of columns and a plurality of rows, wherein when one of the rows is selected, each of the pixel circuits in the selected row senses an image, and generates a pixel signal including a reset signal and an image signal; a plurality of slope analog-to-digital converters (ADC), wherein each of the slope ADC is coupled to the corresponding column, and generates a digital sampling signal according to a ramp signal together with the pixel signal including the reset signal and the image signal which are generated by the pixel circuit located in the selected row and in the column corresponding to the slope ADC; and a ramp signal generator, which is configured to operably generate the ramp signal, wherein the ramp signal generator includes an active integrator, and the active integrator is configured to operably generate the ramp signal by charging an integration capacitor therein with a gain current, wherein the active integrator is an analog circuit.

In one preferable embodiment, the ramp signal generator includes: a gain current generation circuit, which is coupled to the active integrator, and is configured to operably generate the gain current; a reference voltage generation circuit, which is coupled to the active integrator, and is configured to operably generate a reference voltage; a reset switch, which is coupled to the integration capacitor, and is configured to operably reset the ramp signal to a predetermined level related to the reference voltage between two successive ramps of the ramp signal; and the active integrator, which is configured to operably generate the ramp signal according to the gain current and the reference voltage.

In one preferable embodiment, the reference voltage generation circuit includes a plurality of dummy pixel circuits connected in parallel for providing the reference voltage; wherein the dummy pixel circuit and the pixel circuit have a same circuit structure, and the dummy pixel circuit is optically blocked for mitigating a common pixel noise.

In one preferable embodiment, the reference voltage generation circuit includes: a predetermined voltage generation circuit, configured to operably generate a predetermined voltage; a sample-and-hold switch, which is coupled between the predetermined voltage generation circuit and the active integrator, and is configured to operate according to a sample-and-hold signal to transmit the predetermined voltage to the active integrator as the reference voltage before a reset ramp segment of the ramp signal; and a hold capacitor, which is coupled to the active integrator, and is configured to operably hold the reference voltage for supplying the reference voltage to the active integrator till the sample-and-hold switch transmits the next predetermined voltage to the active integrator.

In one preferable embodiment, the gain current generation circuit includes: a switch capacitor load, which has an equivalent conductance proportional to both a capacitance and an operation frequency of the switch capacitor load; and a voltage-to-current converter circuit, which generates the gain current according to the reference voltage and the equivalent conductance, wherein the gain current is proportional to the equivalent conductance of the switch capacitor load.

In one preferable embodiment, the ramp signal includes a reset ramp segment and an image ramp segment which are corresponding to the reset signal and the image signal respectively, and the digital sample signal is related to a level difference between the reset signal and the image signal.

In one preferable embodiment, the active integrator includes an operational amplifier, wherein the operational amplifier has an inverting input terminal coupled to the gain current generation circuit, and a non-inverting input terminal coupled to the reference voltage generation circuit for receiving the reference voltage.

From another perspective, the present invention provides a ramp signal generator of an image sensor circuit, wherein the image sensor includes: an active pixel sensor (APS) array which includes a plurality of pixel circuits arranged in an array of a plurality of columns and a plurality of rows, wherein when one of the rows is selected, each of the pixel circuits in the selected row senses an image, and generates a pixel signal including a reset signal and an image signal; a plurality of slope analog-to-digital converter (ADC), wherein each of the slope ADC is coupled to the corresponding column, and generates a digital sampling signal according to a ramp signal together with the pixel signal including the reset signal and the image signal which are generated by the pixel circuit located in the selected row and in the column corresponding to the slope ADC; and the ramp signal generator, which is configured to operably generate the ramp signal, the ramp signal generator comprising: an active integrator, which is configured to operably generate the ramp signal according to a gain current and a reference voltage; a gain current generation circuit, which is coupled to the active integrator, and is configured to operably generate the gain current; a reference voltage generation circuit, which is coupled to the active integrator, and is configured to operably generate the reference voltage; and a reset switch, which is coupled to the integration capacitor, and is configured to operably reset the ramp signal to a predetermined level related to the reference voltage between two successive ramps of the ramp signal; wherein the active integrator is an analog circuit.

In one preferable embodiment, the reference voltage generation circuit includes a plurality of dummy pixel circuits connected in parallel for providing the reference voltage; wherein the dummy pixel circuit and the pixel circuit have a same circuit structure, and the dummy pixel circuit is optically blocked for mitigating a common pixel noise.

In one preferable embodiment, the reference voltage generation circuit includes: a predetermined voltage generation circuit, configured to operably generate a predetermined voltage; a sample-and-hold switch, which is coupled between the predetermined voltage generation circuit and the active integrator, and is configured to operate according to a sample-and-hold signal to transmit the predetermined voltage to the active integrator as the reference voltage before a reset ramp segment of the ramp signal; and a hold capacitor, which is coupled to the active integrator, and is configured to operably hold the reference voltage for supplying the reference voltage to the active integrator till the sample-and-hold switch transmits the next predetermined voltage to the active integrator.

In one preferable embodiment, the gain current generation circuit includes: a switch capacitor load, which has an equivalent conductance proportional to both a capacitance and an operation frequency of the switch capacitor load; and a voltage-to-current converter circuit, which generates the gain current according to the reference voltage and the equivalent conductance, wherein the gain current is proportional to the equivalent conductance of the switch capacitor load.

In one preferable embodiment, the ramp signal includes a reset ramp segment and an image ramp segment which are corresponding to the reset signal and the image signal respectively, and the digital sample signal is related to a level difference between the reset signal and the image signal.

In one preferable embodiment, the active integrator includes an operational amplifier, wherein the operational amplifier has an inverting input terminal coupled to the gain current generation circuit, and a non-inverting input terminal coupled to the reference voltage generation circuit for receiving the reference voltage.

The objectives, technical details, features, and effects of the present invention will be better understood with regard to the detailed description of the embodiments below.

DESCRIPTION OF THE PREFERRED EMBODIMENTS

The drawings as referred to throughout the description of the present invention are for illustration only, to show the interrelations between the circuits and the signal waveforms, but not drawn according to actual scale.

Figure 1A:
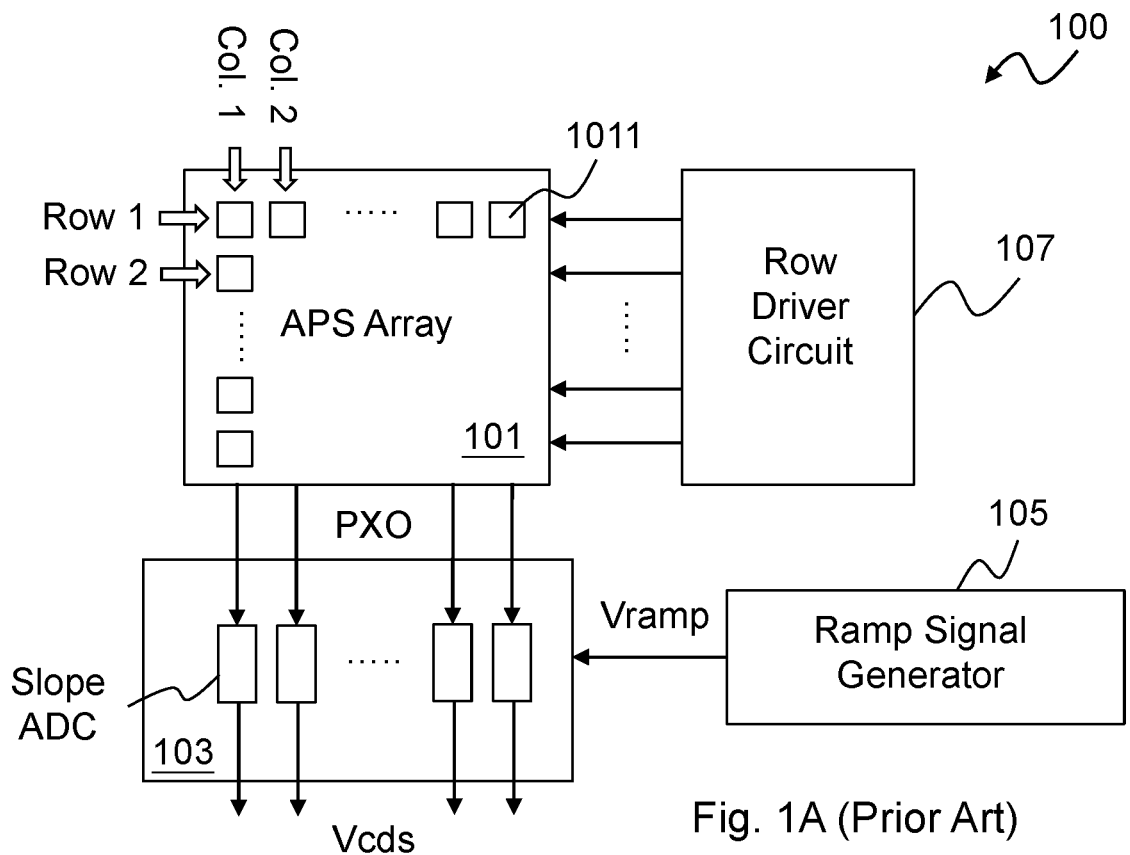
FIG. 1A shows a schematic diagram of a prior art image sensor circuit 100.
Figure 1B:
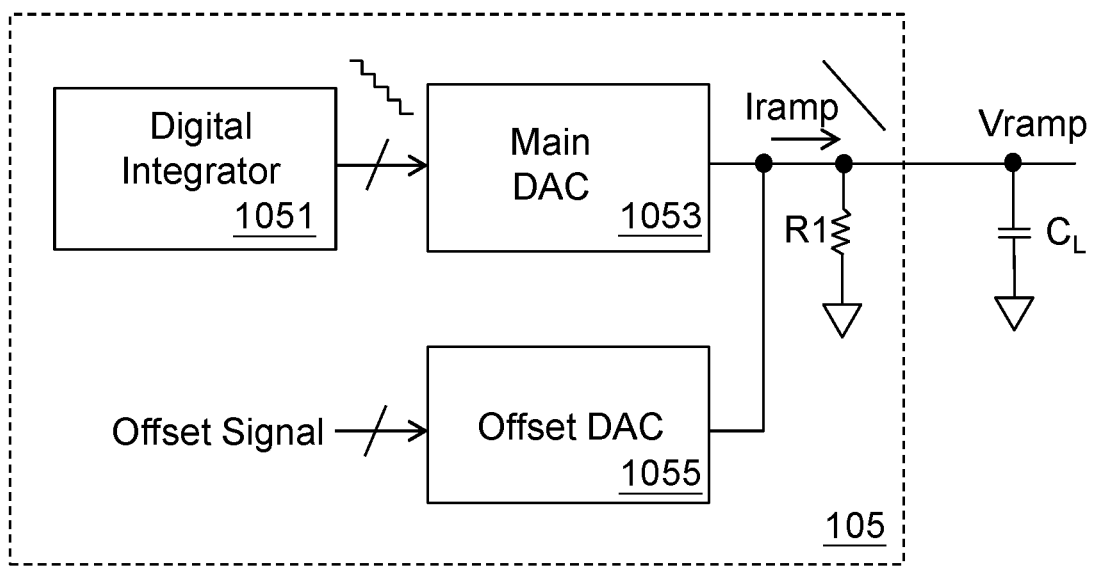
FIG. 1B shows a schematic diagram of a prior art ramp signal generator 105.
Figure 2A:
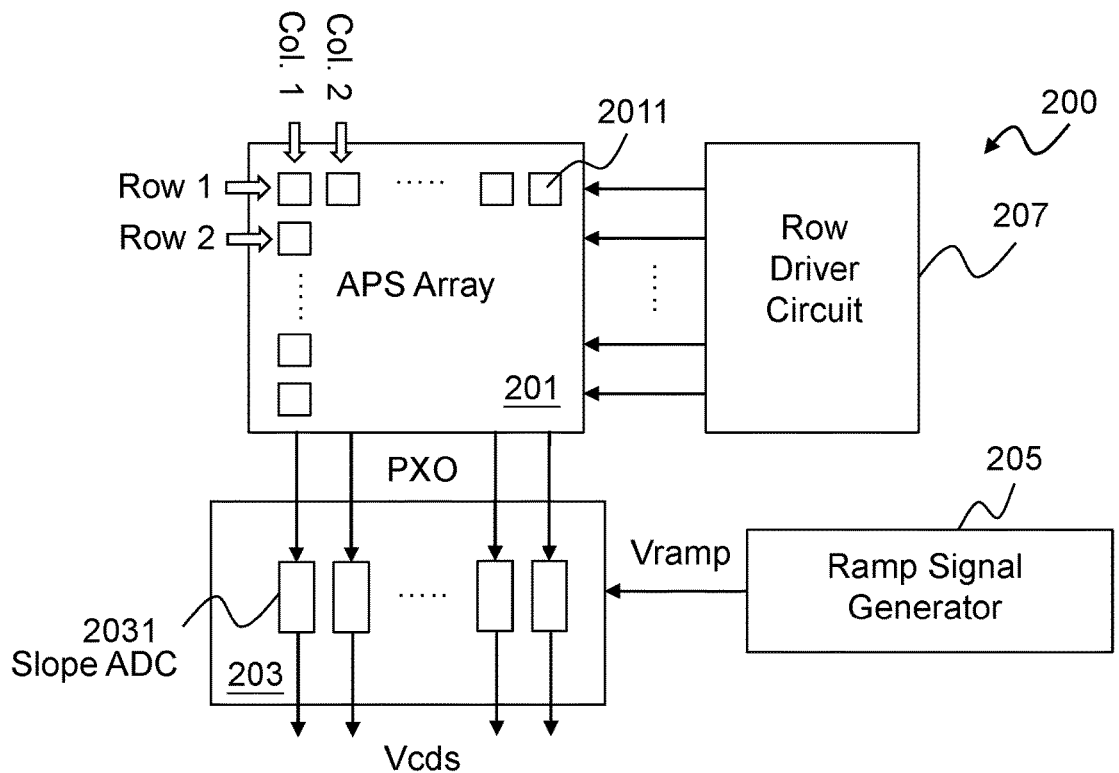
FIGS. 2A-2D show a first embodiment of the present invention.

Please refer to FIGS. 2A-2D for a first embodiment according to the present invention. As shown in FIG. 2A, the image sensor circuit 200 includes: an active pixel sensor (APS) array 201, a column slope analog-to-digital converter (ADC) circuit 203, a ramp signal generator 205, and a row driver circuit 207. The APS array 201 includes plural pixel circuits arranged in an array of plural columns and rows, wherein when one of the rows is selected, each of the pixel circuits 2011 in the selected row senses an image, and generates a pixel signal PXO including a reset signal PXO_rst and an image signal PXO_img. The row driver circuit 207 is for selecting one of the rows in a predetermined order, for example row by row in sequence.

The column slope ADC circuit 203 includes plural slope ADCs 2031, wherein each of the slope ADC 2031 is coupled to the corresponding column of the APS array 201. Each slope ADC 2031 generates a digital sampling signal Vcds according to a ramp signal Vramp together with the pixel signal PXO including the reset signal PXO_rst and an image signal PXO_img which are generated by the pixel circuit 2011 located in the selected row and in the column corresponding to the slope ADC 2031. The slope ADC 2031 receives the ramp signal Vramp, and compares the ramp signal Vramp with the pixel signal PXO including the reset signal PXO_rst and the image signal PXO_img which are generated by selected pixel circuit 2011. In general, the digital sampling signal Vcds is related to a difference between the reset signal PXO_rst and the image signal PXO_img. An image which is sensed by the pixel circuits 2011 may be expressed by the digital sampling signal Vcds.

The ramp signal generator 205 is configured to generate the ramp signal Vramp. The ramp signal generator 205 includes an active integrator (not shown in FIGS. 2A-2D, will be described in details later). The active integrator generates the ramp signal Vramp by charging an integration capacitor with a gain current, wherein the active integrator is an analog circuit, and the gain current is a current having an analog level, which charges an integration capacitor therein directly without a digital-to-analog conversion, to generate the ramp signal Vramp. As thus, the drawbacks of the quantization error and the power/bandwidth problem in the prior art are solved according to the present invention.

Figure 2B:
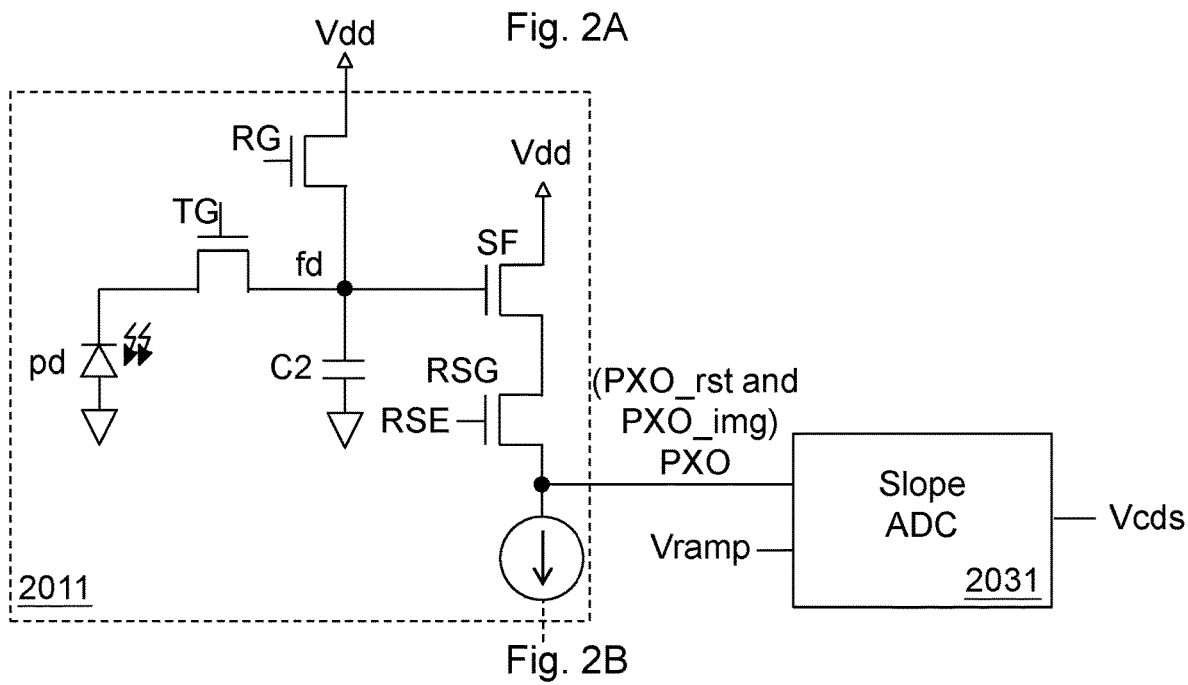

In the APS array 201, for example but not limited to a more specific pixel circuit 2011 is shown in FIG. 2B. The pixel circuit 2011 includes: a photosensor segment pd, for example but not limited to a photodiode, a photogate, or a photoconductor, for receiving the image to generate and accumulate photo-generated charges; a floating diffusion node fd, for storing floating diffusion charges; a transfer gate TG, which is coupled between the photosensor segment pd and the floating diffusion node fd to transfer at least part of the photo-generated charges to the floating diffusion node fd as floating diffusion charges stored in a capacitor C2; a reset transistor RG, which is coupled to the floating diffusion node fd in this embodiment, for resetting the floating diffusion node fd to an internal voltage Vdd; a source follower transistor SF, which buffers fd voltage; and a row selection transistor RSG coupled to a source node of source follower transistor SF, the row selection transistor RSG being controlled by a row selection signal RSE, to enable the row selection transistor RSG to select a corresponding row, and to output the pixel signal PXO including the reset signal PXO_rst and the image signal PXO_img to the slope ADC circuit 2031.

Figure 2C:
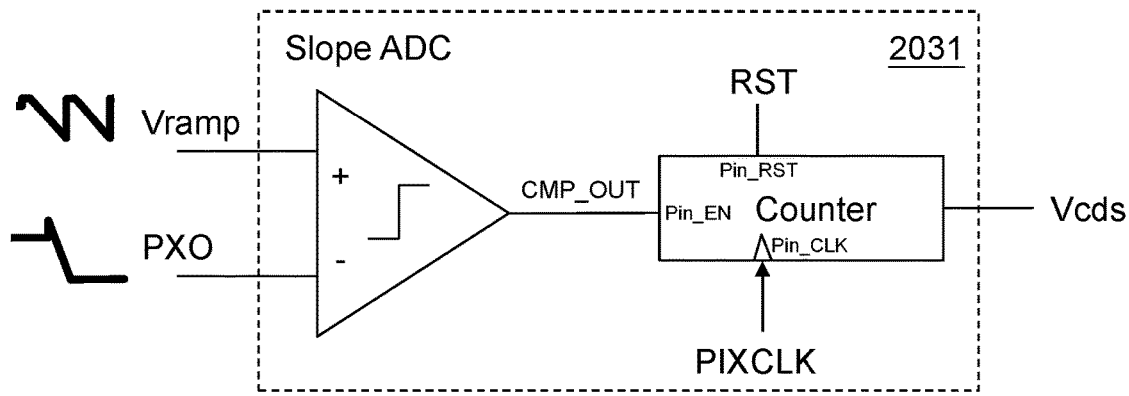
Figure 2D:
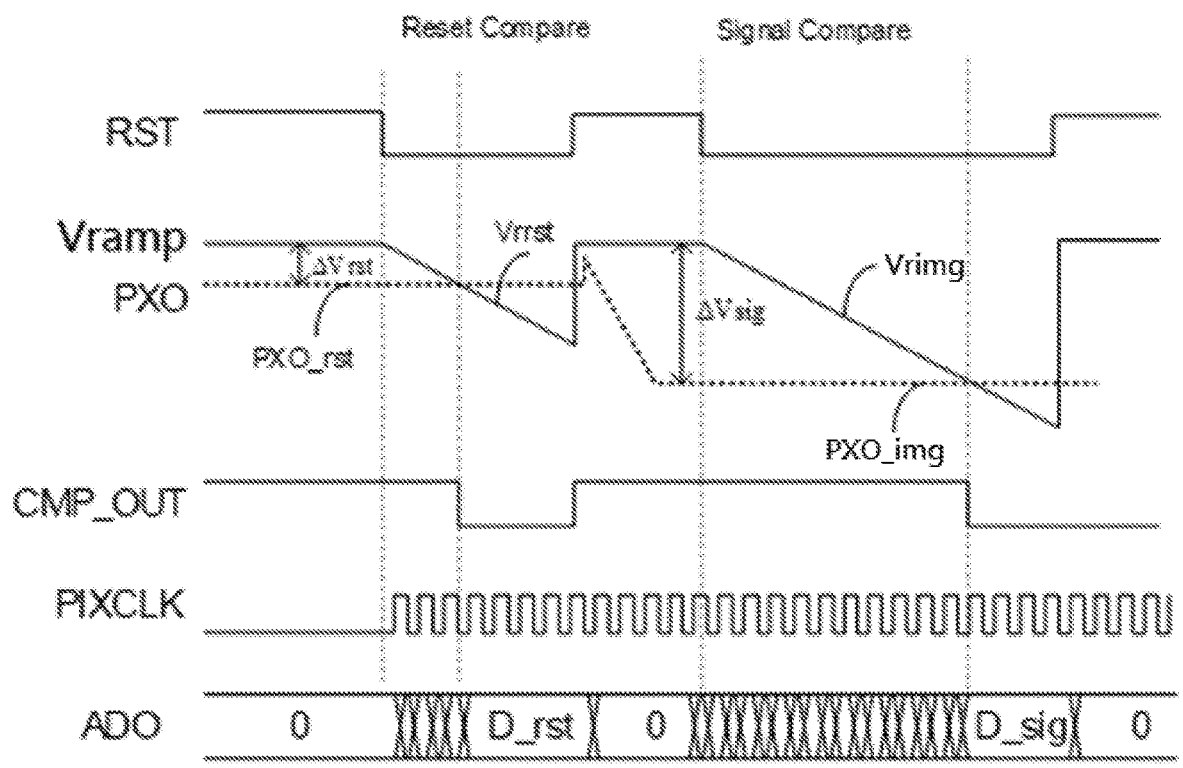

FIG. 2C shows a more specific embodiment of the slope ADC 2031. FIG. 2D shows schematic diagrams of signal waveforms according to the present invention. As shown in FIG. 2C, the slope ADC 2031 includes a comparator and a counter. The comparator compares the ramp signal Vramp with the pixel signal PXO to generate a comparison result CMP_OUT. The counter has a counter reset pin Pin_RST, a counter enable pin Pin_EN and a counter clock pin Pin_CLK.

Still referring to FIGS. 2C and 2D, the counter receives a signal RST with the reset pin Pin_RST, and when the signal RST is at a high level, the ramp signal Vramp is kept at a predetermined level. The ramp signal Vramp starts ramping down when the signal RST changes to a low level from the high level. The ramp signal Vramp for example includes two ramps: a reset ramp segment Vrrst and an image ramp segment Vrimg. The comparator receives the ramp signal Vramp and the pixel signal PXO to generate the comparison result COMP_OUT which is inputted to the enable pin Pin_EN of the counter. The counter counts to generate a digital count signal ADO when the comparison result COMP_OUT is at the high level and the signal RST is at the low level. The reset ramp segment Vrrst is used to sense a voltage level of the reset signal PXO_rst, and the image ramp segment Vrimg is used to sense a voltage level of the image signal PXO_img. The counter counts every period with a clock signal PIXCLK between a time point of the signal RST changing from the high level to the low level and another time point of the comparison result COMP_OUT changing from the high level to the low level, to generate the digital count signal ADO. The digital count signal ADO includes a reset count D_rst and a signal count D_sig corresponding to the reset ramp segment Vrrst and the image ramp segment Vrimg respectively.

Therefore, the reset count D_rst indicates the voltage level of the reset signal PXO_rst, and the signal count D_sig indicates the voltage level of the image signal PXO_img. The reset count D_rst and the signal count D_sig indicating the voltage levels of the reset signal PXO_rst and the image signal PXO_img respectively can be represented as:

$$D\_rst = \Delta Vrst/Slope/Tpix \quad (1)$$

$$D\_sig = \Delta Vsig/Slope/Tpix \quad (2)$$

wherein Slope=dVramp/dt is time derivative of ramp signal Vramp; and Tpix is the aforementioned period counted by the clock signal PIXCLK. The digital sampling signal Vcds can be represented as:

$$Vcds = D\_sig - D\_rst \quad (3)$$

According to the aforementioned equations (1)~(3), with the fixed voltage levels of the pixel signal PXO signal in the periods respectively (i.e., ΔVrst and ΔVsig are constants within the periods respectively), the digital sampling signal Vcds is determined by the period Tpix and the time derivative Slope of the ramp signal Vramp.

The present invention is different from the prior art in that: in this present invention, the ramp signal generation circuit includes the active integrator which operates in the analog domain. The gain current charges the integration capacitor in the active integrator, to generate the ramp signal. Thus the drawbacks in the prior art are solved; the quantization error in the prior art is avoided. The present invention has relatively higher linearity, smaller circuitry area, lower power consumption, and lower circuit complexity, compared to the prior art.

Figure 3:
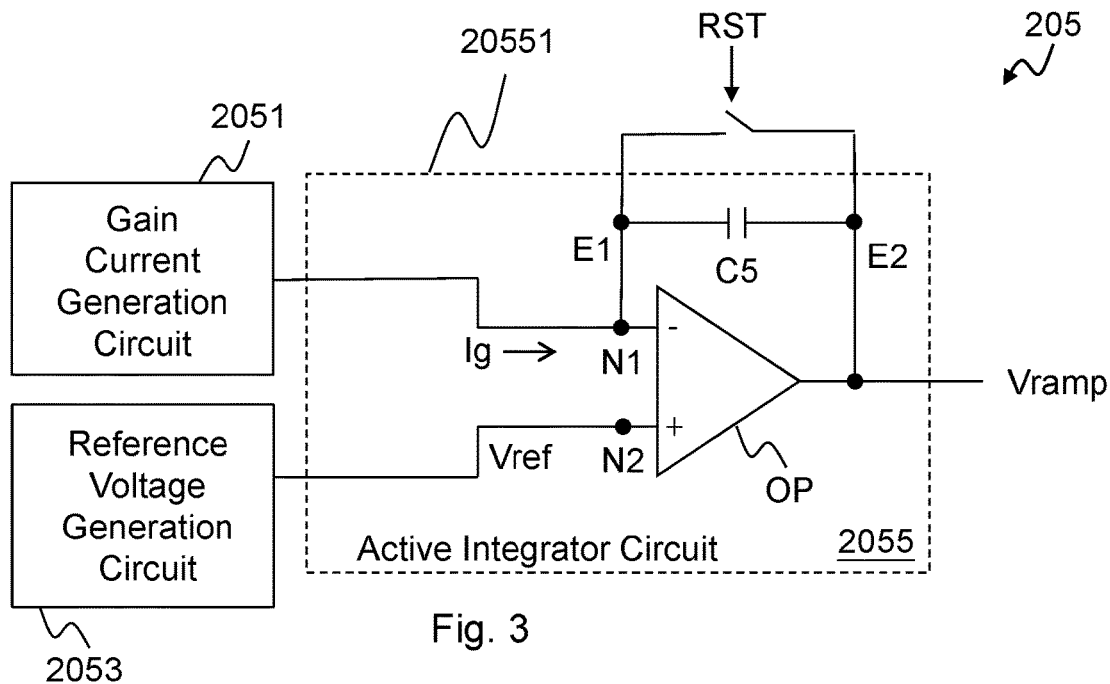
FIG. 3 shows a second embodiment of the present invention.

FIG. 3 shows a second embodiment of the present invention. This embodiment shows a more specific embodiment of the ramp signal generation circuit 205. As shown in FIG. 3, the ramp signal generation circuit 205 includes: a gain current generation circuit 2051, a reference voltage generation circuit 2053, a reset switch, and an active integrator 2055. The gain current generation circuit 2051 is coupled to the active integrator 2055, and is configured to operably generate the gain current Ig, to be supplied to the active integrator 2055, for charging the integration capacitor C5 in the active integrator 2055, so as to generate the ramp signal Vramp. The reference voltage generation circuit 2053 is coupled to the active integrator 2055, for generating a reference voltage Vref to be inputted to the active integrator 2055.

The reset switch is coupled to integration capacitor C5 to reset the ramp signal Vramp to the predetermined level related to the reference voltage Vref between two successive ramps (i.e., the reset ramp segment Vrrst and the image ramp segment Vrimg) of the ramp signal Vramp according to reset signal RST. The active integrator 2055 is configured to operably generate the ramp signal Vramp according to the gain current Ig and the reference voltage Vref. As shown in the figure, the active integrator 2055 includes an operational amplifier OP, wherein the operational amplifier OP has an inverting input terminal(−) coupled to the gain current generation circuit 2051, and a non-inverting input terminal (+) coupled to the reference voltage generation circuit 2053 for receiving the reference voltage Vref. The slope of the ramp signal Vramp can be represented as:

$$\text{Slope} = Ig/C5 \quad (4)$$

Wherein the gain current Ig is a current flowing through the integration capacitor C5, wherein the integration capacitor C5 has a capacitance C5. The active integrator 2055 is configured to operably generate the ramp signal Vramp according to the gain current Ig and the reference voltage Vref.

Because the image is sensed and read out row by row by column slope ADC circuit 203, any temporal noise that is common to each slope ADC 2031 will be superposed as row-wise noise in an image frame, such as noise of the ramp signal Vramp and noise that is common to each pixel circuit (common pixel noise) in the same row. The row-wise noise fluctuates with time and, if it is not properly mitigated, the row-wise noise will be easily noticed by human eye. Therefore, it is important to mitigate the row-wise noise which come from both the common pixel noise and ramp signal Vramp.

Figure 4:
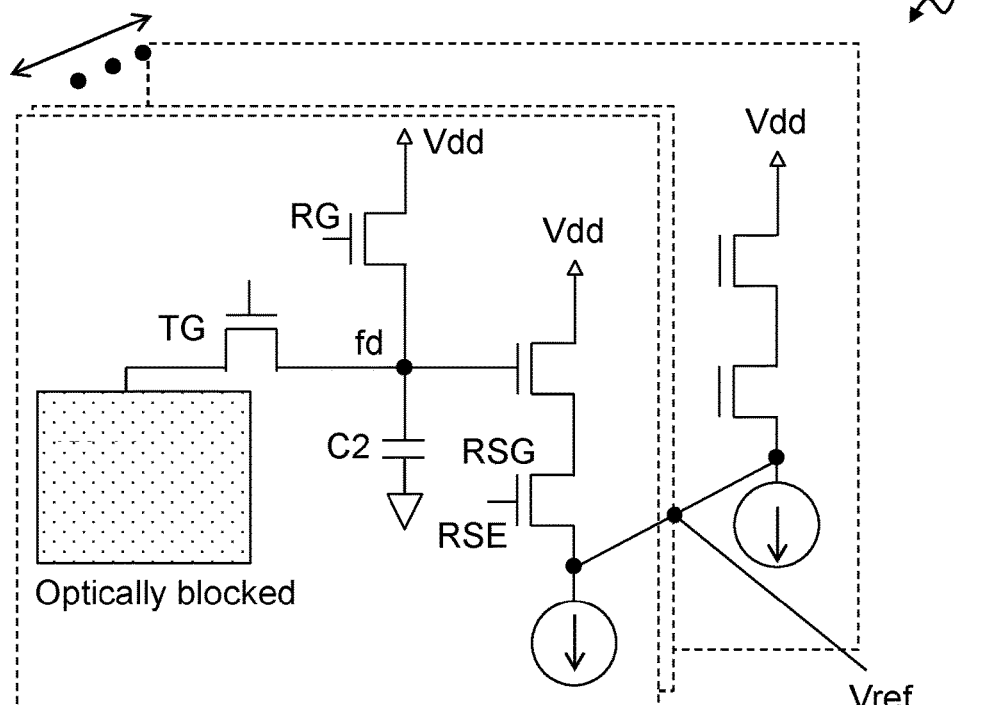
FIG. 4 shows a third embodiment of the present invention.

FIG. 4 shows a third embodiment of the present invention. This embodiment shows a more specific embodiment of the reference voltage generation circuit 2053. As shown in FIG. 4, in one embodiment, the reference voltage generation circuit 2053 includes plural dummy pixel circuits connected in parallel for providing the reference voltage Vref, wherein the dummy pixel circuit and the pixel circuit 2011 have a same circuit structure. In a normal operation, the photosensor segment pd of the dummy pixel circuit is shaded from light (i.e., optically blocked) and/or the transfer gate TG thereof is not activated, such that the photosensor segment pd of the dummy pixel circuit does not sense the image which is sensed by the pixel circuit 2011 in the normal operation and/or the floating diffusion node fd thereof does not receive electrons from photosensor segment pd.

The active integrator 2055 generates the ramp signal Vramp according to the reference voltage Vref which is for example generated by the plural dummy pixel circuits. The ramp signal Vramp may contain the common pixel noise such as noise from the transfer gate TG, the reset transistor RG, the row selection signal RSE and the internal voltage Vdd. The slope ADC 2031 compares the ramp signal Vramp with the pixel signal PXO which is generated by the pixel circuit 2011, wherein both the ramp signal Vramp and the pixel signal PXO have the same common pixel noise, because the dummy pixel circuit in the reference voltage generation circuit 2053 and the pixel circuit 2011 have the same circuit structure. As thus, the common pixel noise will be canceled automatically and is not included in the row-wise noise in a read out digital sampling signal Vcds. The reason why the plural dummy pixel circuits are connected in parallel is to average dummy pixel noise which is different from one dummy pixel circuit to another dummy pixel circuit. For example, noises from the different source followers SF in the different dummy pixel circuits are different.

Figure 5A:
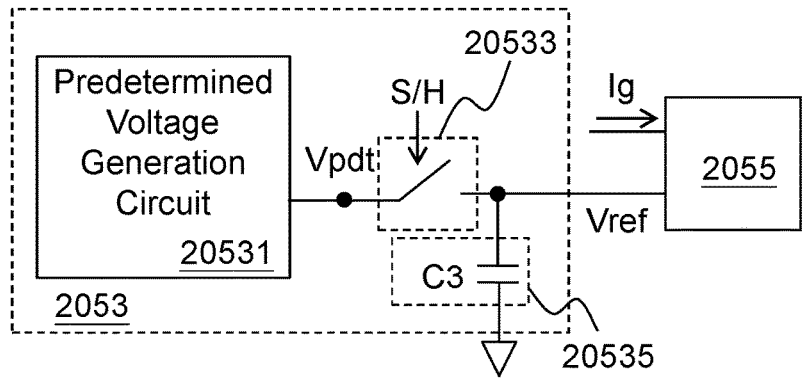
FIGS. 5A-5B shows a fourth embodiment of the present invention.
Figure 5B:
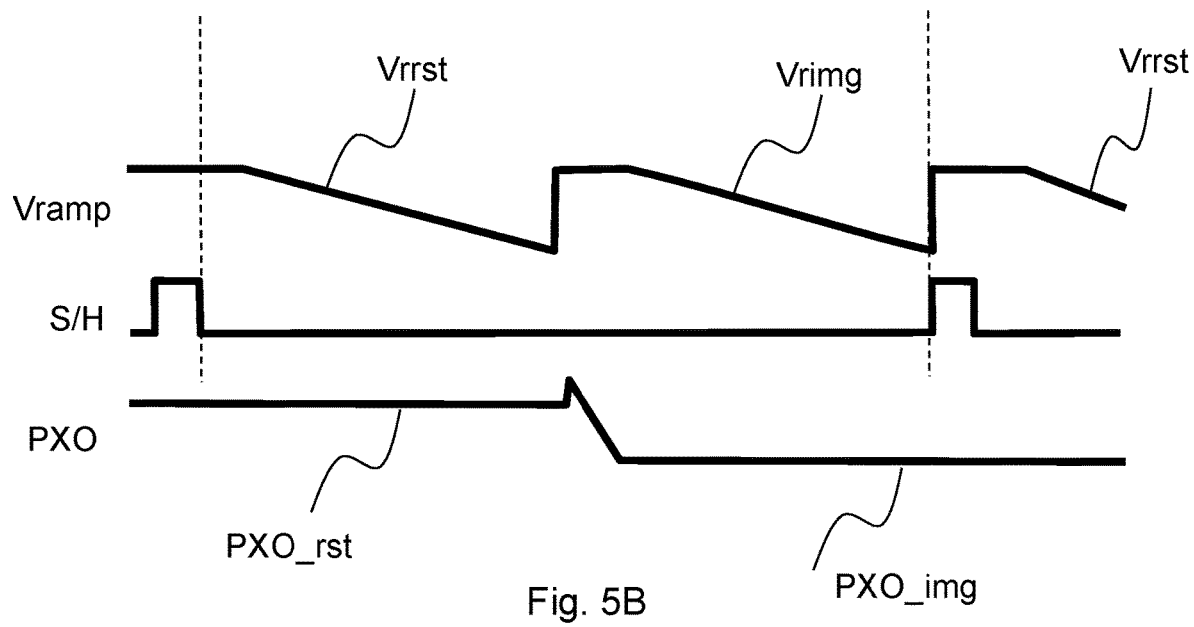

FIGS. 5A and 5B show a fourth embodiment of the present invention. This embodiment shows another more specific embodiment of the reference voltage generation circuit 2053. As shown in FIG. 5A, in one embodiment, the reference voltage generation circuit 2053 includes a predetermined voltage generation circuit 20531, a sample-and-hold switch 20533, and a hold capacitor 20535. The predetermined voltage generation circuit 20531 is configured to operably generate a predetermined voltage Vpdt. The sample-and-hold switch 20533 is coupled between the predetermined voltage generation circuit 20531 and the active integrator 2055. The sample-and-hold switch 20533 operates according to a sample-and-hold signal S/H, to transmit the predetermined voltage Vpdt to the active integrator 2055 as the reference voltage Vref, before the ramp signal Vramp enters a reset ramp segment Vrrst of. As shown in FIG. 5B, the ramp signal Vramp includes two ramp segments, the reset ramp segment Vrrst and an image ramp segment Vrimg. The reset ramp segment Vrrst is used to sense a voltage level of the reset signal PXO_rst, and the image ramp segment Vrimg is used to sense the voltage level of the image signal PXO_img. The sample-and-hold signal S/H is changed from a low level to a high level before the reset ramp segment Vrrst, to turn ON the sample-and-hold switch 20533, so as to transmit the predetermined voltage Vpdt to the active integrator 2055 as the reference voltage Vref.

The hold capacitor 20535 is coupled to the active integrator 2055. The hold capacitor 20535 holds the reference voltage Vref till a next time point when the sample-and-hold switch 20533 transmits the next predetermined voltage Vpdt to the active integrator 2055 (i.e., in a period between two dashed lines as shown in FIG. 5B), so as to supply a stable reference voltage Vref to the active integrator 2055. As shown in FIG. 5A, the hold capacitor 20535 includes for example but not limited to a capacitor C3, which is electrically connected to the sample-and-hold switch 20533 and the active integrator 2055. The capacitor C3 maintains the reference voltage Vref so that the active integrator 2055 receives a stable reference voltage Vref during the reset ramp segment Vrrst and the image ramp segment Vrimg. One advantage of this method, wherein the sample-and-hold circuit 20535 maintains the reference voltage Vref to be stably inputted to the active integrator 2055, is relatively lower power consumption.

Figure 6:
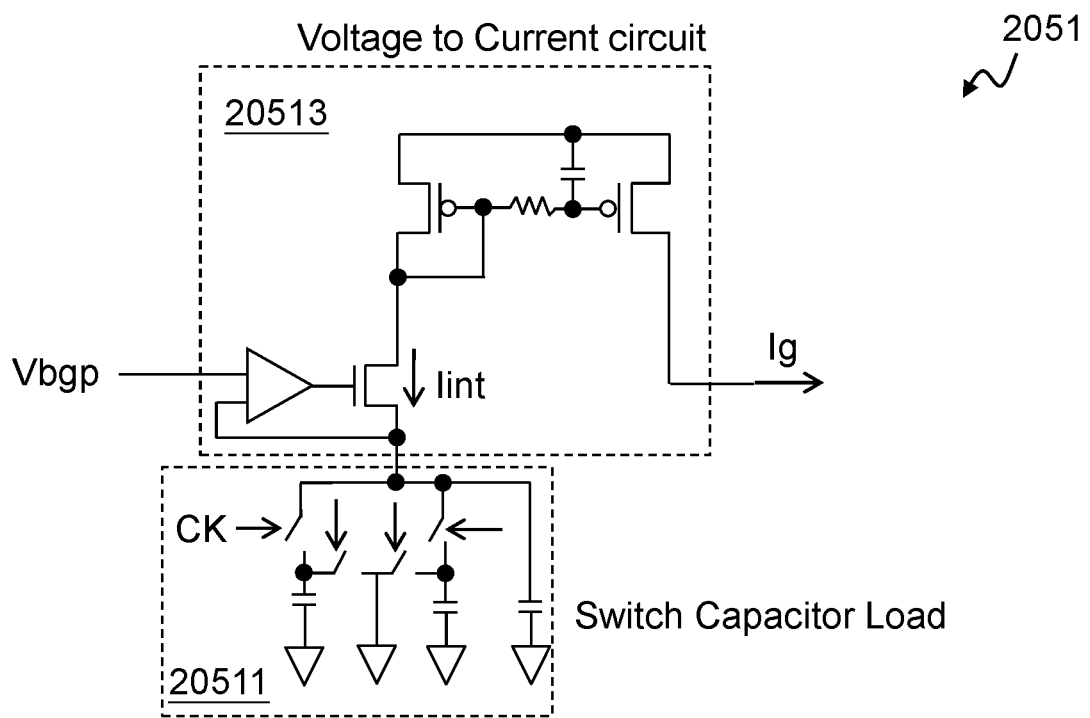
FIG. 6 shows a fifth embodiment of the present invention.

FIG. 6 shows a fifth embodiment according to the present invention. This embodiment shows an embodiment of the gain current generation circuit 2051. As shown in FIG. 6, in one preferable embodiment, the gain current generation circuit 2051 includes: a switch capacitor load 20511 which operates by an operation signal CK at a switching frequency fpix, and a voltage-to-current circuit (V-to-I) 20513. The switch capacitor load 20511 has an equivalent conductance Geq which is proportional to a capacitance of the switch capacitor load 20511 and the switching frequency fpix. The V-to-I circuit 20513 converts a predetermined voltage Vbgp to the gain current Ig according to the equivalent conductance of the switch capacitor load 20511, wherein the gain current Ig is proportional to the predetermined voltage Vbgp and the equivalent conductance Geq, as:

$$Ig \propto Vbgp * Geq \quad (5)$$

Figure 7:
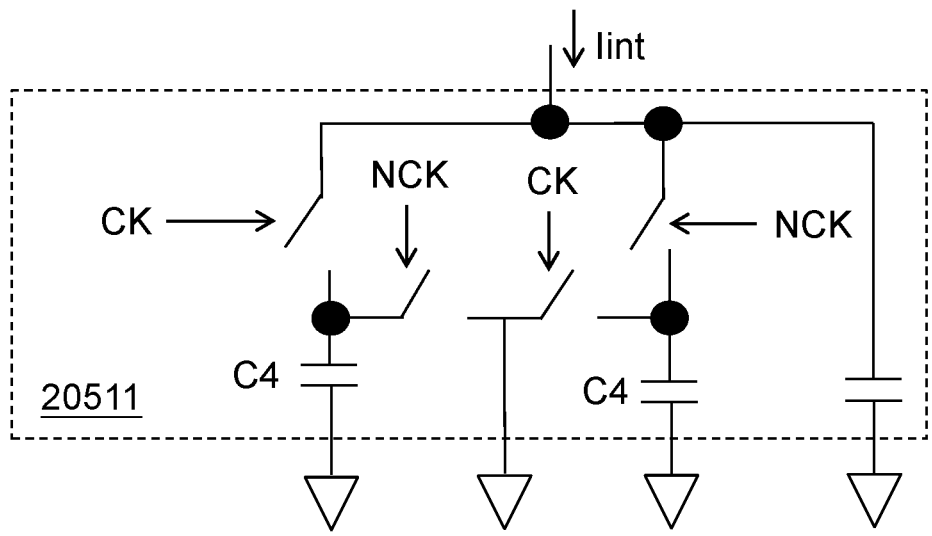
FIG. 7 shows a sixth embodiment of the present invention.

FIG. 7 shows one preferred embodiment of the switch capacitor load 20511. In this embodiment, the switch capacitor load 20511 includes four switches and two capacitors C4 which have a same capacitor type with the integration capacitor C5, i.e., the capacitance C5 is proportional to a capacitance C4 of the capacitor C4 with a predetermined capacitance ratio:

$$C5 = M * C4 \quad (6)$$

Because the capacitors C4 and C5 are the same capacitor type, there is no variation due to manufacturing process of the capacitors C4 and C5, and a capacitance ratio M between the capacitors C4 and C5 will be kept a constant irrespective of the manufacturing process variation.

The four switches are controlled by the two operation signals CK and two complementary operation signals NCK thereof, that is, the operation signal CK and the complementary operation signal NCK are complementary to each other, wherein the operation signal CK and the complementary operation signal NCK operate the switches according to the switching frequency fpix. The equivalent conductance Geq generated by the switch capacitor load 20511 is:

$$Geq = 2 \times fpix \times C4 \quad (7)$$

According to equations (1), (4)-(7), the reset count D_rst can be represented as:

$$D\_rst \propto \frac{\Delta Vrst}{Slope * Tpix} =$$

$$\frac{\Delta Vrst}{\frac{Ig}{C5} * Tpix} = \frac{\Delta Vrst}{\frac{Vbgp * 2 * fpix * C4}{C5} * Tpix} \xrightarrow{fpix = 1/Tpix, C5 = M*C4} \frac{\Delta Vrst}{Vbgp} * \frac{M}{2}$$

Similarly, $$D\_sig \propto \frac{\Delta Vsig}{Vbgp} * \frac{M}{2} \Rightarrow V\_cds = D\_sig - D\_rst = \frac{\Delta Vsig - \Delta Vrst}{Vbgp} * \frac{M}{2}$$

From above, the read out digital sampling signal Vcds is independent of the switching frequency fpix (i.e., a frequency of pixel clock signal) and capacitances C4 and C5. The problem that digital sampling signal Vcds will vary for different frequency setting and process variation is solved according to the present invention.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. For example, a device or circuit which does not substantially influence the primary function of a signal can be inserted between any two devices or circuits in the shown embodiments, so the term "couple" should include direct and indirect connections. For another example, the input terminals of a comparator circuit are interchangeable, with corresponding modifications of circuits processing these signals. For another example, the resistor or the voltage divider circuit is not limited to a circuit formed by passive devices, but it may be formed by other circuits, such as transistors. For another example, when a circuit retrieves an external signal, before the external signal is processed inside the circuit, a voltage-to-current conversion, a current-to-voltage conversion, or/and a ratio conversion, etc. may be performed in advance, and therefore, "processing or operating according to a certain signal" in the present invention, is not strictly limited to processing or operating according to the signal itself, but may be processing or operating according to a signal which is pre-processed by the aforementioned conversions. For another example, variations of all the embodiments are interchangeable. As an example, the sample-and-hold circuit 20535 of the fourth embodiment shown in FIG. 5A can be used in other embodiments. In view of the foregoing, the spirit of the present invention should cover all such and other modifications and variations, which should be interpreted to fall within the scope of the following claims and their equivalents.

What is claimed is:

1. An image sensor circuit, comprising:
an active pixel sensor (APS) array which includes a plurality of pixel circuits arranged in an array of a plurality of columns and a plurality of rows, wherein when one of the rows is selected, each of the pixel circuits in the selected row senses an image, and generates a pixel signal including a reset signal and an image signal;
a plurality of slope analog-to-digital converters (ADC), wherein each of the slope ADC is coupled to the corresponding column, and generates a digital sampling signal according to a ramp signal together with the pixel signal including the reset signal and the image signal which are generated by the pixel circuit located in the selected row and in the column corresponding to the slope ADC; and
a ramp signal generator, which is configured to operably generate the ramp signal, wherein the ramp signal generator includes an active integrator, and the active integrator is configured to operably generate the ramp signal by charging an integration capacitor therein with a gain current, wherein the active integrator is an analog circuit;
wherein the ramp signal generator includes:
a gain current generation circuit, which is coupled to the active integrator, and is configured to operably generate the gain current;
a reference voltage generation circuit, which is coupled to the active integrator, and is configured to operably generate a reference voltage;
a reset switch, which is coupled to the integration capacitor, and is configured to operably reset the ramp signal to a predetermined level related to the reference voltage between two successive ramps of the ramp signal; and
the active integrator, which is configured to operably generate the ramp signal according to the gain current and the reference voltage;

wherein the reference voltage generation circuit includes:
a predetermined voltage generation circuit, configured to operably generate a predetermined voltage;
a sample-and-hold switch, which is coupled between the predetermined voltage generation circuit and the active integrator, and is configured to operate according to a sample-and-hold signal to transmit the predetermined voltage to the active integrator as the reference voltage before a reset ramp segment of the ramp signal; and
a hold capacitor, which is coupled to the active integrator, and is configured to operably hold the reference voltage for supplying the reference voltage to the active integrator till the sample-and-hold switch transmits the next predetermined voltage to the active integrator.

2. The image sensor circuit of claim 1, wherein the reference voltage generation circuit includes a plurality of dummy pixel circuits connected in parallel for providing the reference voltage; wherein the dummy pixel circuit and the pixel circuit have a same circuit structure, and the dummy pixel circuit is optically blocked for mitigating a common pixel noise.

3. An image sensor circuit, comprising:
an active pixel sensor (APS) array which includes a plurality of pixel circuits arranged in an array of a plurality of columns and a plurality of rows, wherein when one of the rows is selected, each of the pixel circuits in the selected row senses an image, and generates a pixel signal including a reset signal and an image signal;
a plurality of slope analog-to-digital converters (ADC), wherein each of the slope ADC is coupled to the corresponding column, and generates a digital sampling signal according to a ramp signal together with the pixel signal including the reset signal and the image signal which are generated by the pixel circuit located in the selected row and in the column corresponding to the slope ADC; and
a ramp signal generator, which is configured to operably generate the ramp signal, wherein the ramp signal generator includes an active integrator, and the active integrator is configured to operably generate the ramp signal by charging an integration capacitor therein with a gain current, wherein the active integrator is an analog circuit;
wherein the ramp signal generator includes:
a gain current generation circuit, which is coupled to the active integrator, and is configured to operably generate the gain current;
a reference voltage generation circuit, which is coupled to the active integrator, and is configured to operably generate a reference voltage;
a reset switch, which is coupled to the integration capacitor, and is configured to operably reset the ramp signal to a predetermined level related to the reference voltage between two successive ramps of the ramp signal; and
the active integrator, which is configured to operably generate the ramp signal according to the gain current and the reference voltage;
wherein the gain current generation circuit includes:
a switch capacitor load, which has an equivalent conductance proportional to both a capacitance and an operation frequency of the switch capacitor load; and
a voltage-to-current converter circuit, which generates the gain current according to the reference voltage and the equivalent conductance, wherein the gain current is proportional to the equivalent conductance of the switch capacitor load.

4. The image sensor circuit of claim 1, wherein the ramp signal includes the reset ramp segment and an image ramp segment which are corresponding to the reset signal and the image signal respectively, and the digital sampling signal is related to a level difference between the reset signal and the image signal.

5. The image sensor circuit of claim 1, wherein the active integrator includes an operational amplifier, wherein the operational amplifier has an inverting input terminal coupled to the gain current generation circuit, and a non-inverting input terminal coupled to the reference voltage generation circuit for receiving the reference voltage.

6. A ramp signal generator of an image sensor circuit, wherein the image sensor includes: an active pixel sensor (APS) array which includes a plurality of pixel circuits arranged in an array of a plurality of columns and a plurality of rows, wherein when one of the rows is selected, each of the pixel circuits in the selected row senses an image, and generates a pixel signal including a reset signal and an image signal; a plurality of slope analog-to-digital converter (ADC), wherein each of the slope ADC is coupled to the corresponding column, and generates a digital sampling signal according to a ramp signal together with the reset signal and the image signal which are generated by the pixel circuit located in the selected row and in the column corresponding to the slope ADC; and the ramp signal generator, which is configured to operably generate the ramp signal, the ramp signal generator comprising:
an active integrator, which is configured to operably generate the ramp signal according to a gain current and a reference voltage;
a gain current generation circuit, which is coupled to the active integrator, and is configured to operably generate the gain current;
a reference voltage generation circuit, which is coupled to the active integrator, and is configured to operably generate the reference voltage; and
a reset switch, which is coupled to an integration capacitor, and is configured to operably reset the ramp signal to a predetermined level related to the reference voltage between two successive ramps of the ramp signal; wherein the active integrator is an analog circuit;
wherein the reference voltage generation circuit includes:
a predetermined voltage generation circuit, configured to operably generate a predetermined voltage;
a sample-and-hold switch, which is coupled between the predetermined voltage generation circuit and the active integrator, and is configured to operate according to a sample-and-hold signal to transmit the predetermined voltage to the active integrator as the reference voltage before a reset ramp segment of the ramp signal; and
a hold capacitor, which is coupled to the active integrator, and is configured to operably hold the reference voltage for supplying the reference voltage to the active integrator till the sample-and-hold switch transmits a next predetermined voltage to the active integrator.

7. The ramp signal generator of claim 6, wherein the reference voltage generation circuit includes a plurality of dummy pixel circuits connected in parallel for providing the reference voltage; wherein the dummy pixel circuit and the pixel circuit have a same circuit structure, and the dummy pixel circuit is optically blocked for mitigating a common pixel noise.

8. A ramp signal generator of an image sensor circuit, wherein the image sensor includes: an active pixel sensor (APS) array which includes a plurality of pixel circuits arranged in an array of a plurality of columns and a plurality of rows, wherein when one of the rows is selected, each of the pixel circuits in the selected row senses an image, and generates a pixel signal including a reset signal and an image signal; a plurality of slope analog-to-digital converter (ADC), wherein each of the slope ADC is coupled to the corresponding column, and generates a digital sampling signal according to a ramp signal together with the reset signal and the image signal which are generated by the pixel circuit located in the selected row and in the column corresponding to the slope ADC; and the ramp signal generator, which is configured to operably generate the ramp signal, the ramp signal generator comprising:

an active integrator, which is configured to operably generate the ramp signal according to a gain current and a reference voltage;

a gain current generation circuit, which is coupled to the active integrator, and is configured to operably generate the gain current;

a reference voltage generation circuit, which is coupled to the active integrator, and is configured to operably generate the reference voltage; and a reset switch, which is coupled to an integration capacitor, and is configured to operably reset the ramp signal to a predetermined level related to the reference voltage between two successive ramps of the ramp signal;

wherein the active integrator is an analog circuit;

wherein the gain current generation circuit includes:

a switch capacitor load, which has an equivalent conductance proportional to both a capacitance and an operation frequency of the switch capacitor load; and a voltage-to-current converter circuit, which generates the gain current according to the reference voltage and the equivalent conductance, wherein the gain current is proportional to the equivalent conductance of the switch capacitor load.

9. The ramp signal generator of claim 6, wherein the ramp signal includes the reset ramp segment and an image ramp segment which are corresponding to the reset signal and the image signal respectively, and the digital sample signal is related to a level difference between the reset signal and the image signal.

10. The ramp signal generator of claim 6, wherein the active integrator includes an operational amplifier, wherein the operational amplifier has an inverting input terminal coupled to the gain current generation circuit, and a non-inverting input terminal coupled to the reference voltage generation circuit for receiving the reference voltage.

* * * * *